(12) United States Patent
Hynes

(10) Patent No.: US 7,180,301 B1
(45) Date of Patent: Feb. 20, 2007

(54) POWER MONITOR-GLITCH TRAP SYSTEM

(75) Inventor: Mark W. Hynes, Sierra Vista, AZ (US)

(73) Assignee: The Untied States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 11/296,709

(22) Filed: Nov. 30, 2005

(51) Int. Cl.
G01R 31/28 (2006.01)
G01R 31/02 (2006.01)
G01R 29/26 (2006.01)

(52) U.S. Cl. .................. 324/522; 324/102; 324/613

(58) Field of Classification Search ........... 324/102, 324/113, 76.17, 522, 613, 620
See application file for complete search history.

(56) References Cited

U.S. PATENT DOCUMENTS

| | | | |
|---|---|---|---|
| 4,156,280 A | 5/1979 | Griess | |
| 4,206,413 A | 6/1980 | Cox et al. | |
| 4,495,621 A * | 1/1985 | Nakagomi et al. | 714/709 |
| 4,641,246 A * | 2/1987 | Halbert et al. | 341/163 |
| 4,672,555 A | 6/1987 | Hart et al. | |
| 4,718,036 A * | 1/1988 | Halbert et al. | 708/823 |
| 4,818,947 A * | 4/1989 | Zucker et al. | 324/623 |
| 5,027,285 A | 6/1991 | McCartney et al. | |
| 5,148,167 A * | 9/1992 | Ribner | 341/143 |
| 5,255,365 A * | 10/1993 | Hungerbuhler | 345/440.1 |
| 5,748,548 A * | 5/1998 | Padoan et al. | 365/226 |
| 6,584,418 B2 * | 6/2003 | Murphy et al. | 702/60 |
| 6,598,003 B1 | 7/2003 | Heino et al. | |
| 7,039,573 B2 * | 5/2006 | Komoda | 703/14 |
| 7,106,045 B2 * | 9/2006 | Jungwirth et al. | 324/113 |

FOREIGN PATENT DOCUMENTS

JP 58106464 A * 6/1983

* cited by examiner

Primary Examiner—Anjan Deb
(74) Attorney, Agent, or Firm—Alan P. Klein

(57) ABSTRACT

A device for sensing and capturing the state of a direct current electrical power line comprising a voltage comparator having a pair of inputs, one of the inputs adapted to be connected to the power line, the other input connected to an analog and digital I/O module for supplying a threshold voltage to the voltage comparator, a plurality of latches, an equal plurality of integrators having different time constants, each integrator connected between the output of the voltage comparator and one of the plurality of latches for supplying an integrated replica of the output from the comparator to the latch, the analog and digital I/O module also being connected to the plurality of latches for reading the states of the respective latches and for resetting any set latch, and a programmed computer connected to the analog and digital I/O module for controlling the operation of the analog and digital module and for logging the occurrence of the setting of a latch.

5 Claims, 1 Drawing Sheet

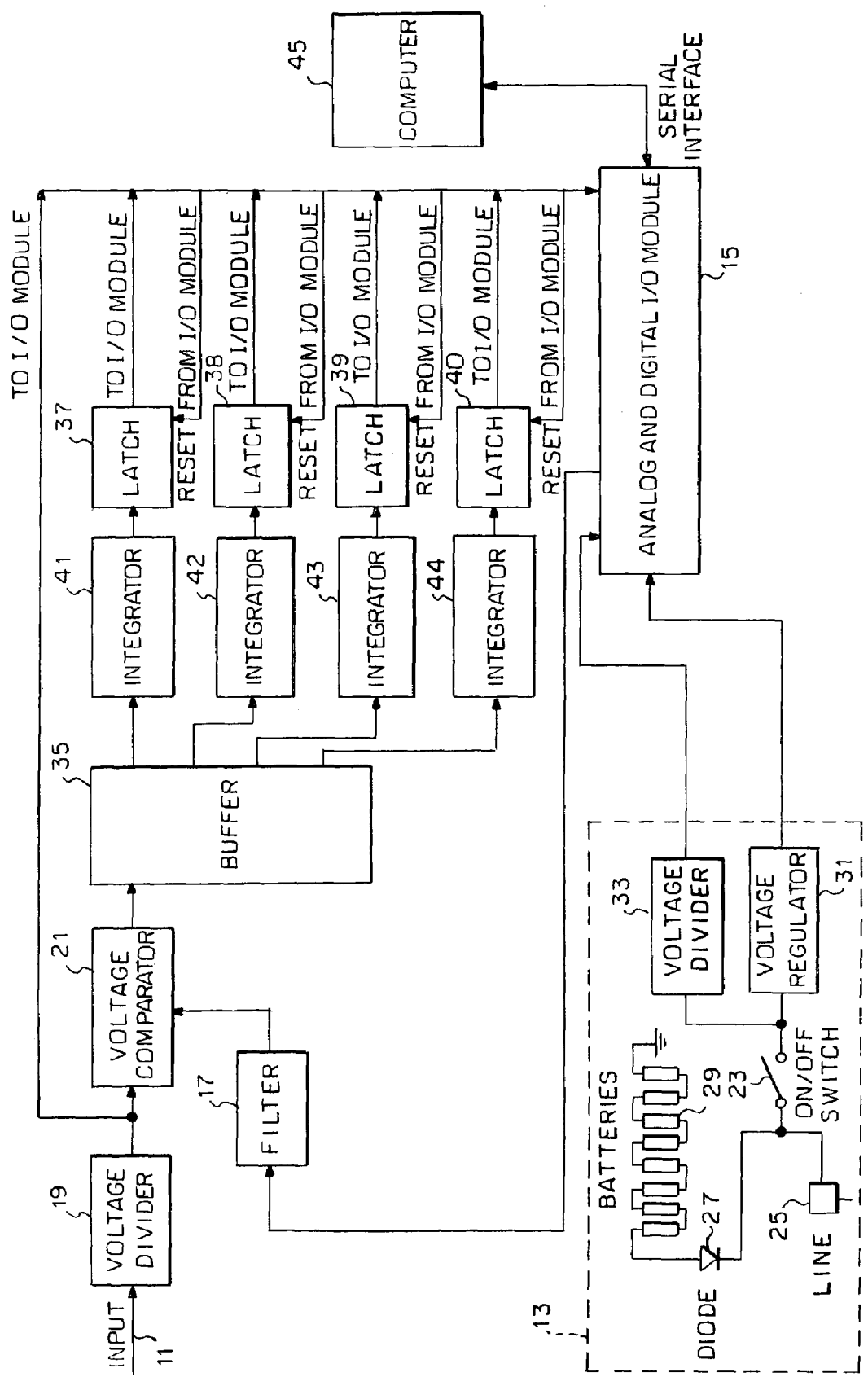

POWER MONITOR-GLITCH TRAP SYSTEM

BACKGROUND OF THE INVENTION

This invention relates in general to power quality monitoring devices.

When direct current electrical power systems are used to distribute power, the quality of the power that is distributed may be degraded by drop-outs or glitches. A drop-out is a momentary reduction in the output voltage of the power system. A glitch is a type of drop-out, specifically, one that is short in duration. A glitch is so short that it is not humanly detectable without the aid of some type of special instrumentation.

SUMMARY OF THE INVENTION

It is therefore an object of this invention to monitor the quality of the power distributed by a direct current electrical power system.

It is another object to detect a glitch in the distributed power.

It is yet another object to record that a glitch has been detected and the extent of the glitch.

These and other objects of the invention are achieved in one aspect by a device for sensing and capturing the state of a direct current electrical power system. The device comprises detecting means adapted to be connected to the direct current electrical power system for detecting a glitch, and recording means connected to the detecting means for recording that a glitch has been detected and the extent of the glitch.

Another aspect of the invention involves a method for sensing and capturing the state of a direct current electrical power line comprising detecting a glitch, and recording that the glitch has been detected and the extent of the glitch.

The device can detect power glitches as small as 30 nanoseconds in duration. It can also measure the length of the glitch. It has an adjustable threshold, which is set up automatically by the device's control software. The device records for later analysis the time and date of each glitch that is detected. It also keeps a running record of the output voltage of the power system.

Additional advantages and features will become apparent as the subject invention becomes better understood by reference to the following detailed description when considered in conjunction with the accompanying drawings wherein:

BRIEF DESCRIPTION OF THE DRAWINGS

The sole FIGURE shows a device for sensing and capturing the state of a direct current electrical power line in accordance with the invention.

DETAILED DESCRIPTION

Referring to the FIGURE, a device for sensing and capturing the state of a direct current electrical power line 11 comprises detecting means adapted to be connected to the direct current electrical power line for detecting a glitch, and recording means connected to the detecting means for recording that a glitch has been detected and the extent of the glitch.

While the detecting means may take a variety of forms, conveniently it may take the form shown in the FIGURE of a power supply 13, an analog and digital I/O module 15 connected to an output of the power supply, a filter 17 connected to an output of the analog and digital I/O module, a voltage divider 19 having an input adapted to be connected to the direct current electrical power line 11 under test and an output connected to an input of the analog and digital I/O module 15, and a voltage comparator 21 having a pair of inputs, one input of the voltage comparator being connected to the output of the voltage divider and the other input of the voltage comparator being connected to the output of the filter. The power supply 13 includes an on-off switch 23 having input and output poles. The input pole of the on-off switch 23 is connected both to a wall transformer 25, and to a diode 27 in series with a battery pack 29. The output pole of the on-off switch 23 is connected both to a voltage regulator 31 whose output is connected to an input of the analog and digital I/O module 15 and to a voltage divider 33 whose output is connected to an input of the analog and digital I/O module 17.

While the recording means may take a variety of forms, conveniently it may take the form shown in FIG. 1 of a buffer 35 connected to the output of the voltage comparator 21, a plurality of latches 37–40 (four are shown), an equal plurality of integrators 41–44 having different time constants (the time when the output of the integrator rises to $1/e=0.368$ times its input), each integrator being connected between the buffer 35 and one of the plurality of latches, a programmed computer 45, and the analog and digital I/O module 15 which is connected between the plurality of latches and the programmed computer.

In operation, the user closes the on-off switch 23 so that the battery pack 29 and the wall transformer 25 supply direct current power to the voltage regulator 31. The diode 27 prevents the higher voltage from the wall transformer 25 from pushing current back through the battery pack 29. In the event of a power failure at the input to the wall transformer 25, the battery pack 29 automatically takes over so that the constant output from the voltage regulator is maintained regardless of which source is providing power to it. The voltage regulator 31 regulates the power from the battery pack 29 and the wall transformer 25 and outputs it to the analog and digital I/O module 15. In addition, the voltage divider 33 subdivides the voltage that is presented to the input of the voltage regulator 31 to provide a power supply voltage sensing signal to the I/O analog and digital module 15 that is compatible with the I/O analog and digital module's operating range. The analog and digital I/O module 15 uses the output signal from the voltage regulator 31 to supply a threshold reference voltage to the voltage comparator 21 by way of the filter 17 at the command of the programmed computer 45 which controls the operation of the analog and digital module. The threshold reference voltage is adjustable and is set automatically by the control program. The voltage divider 19 divides the voltage on the direct current electrical power line 11 and presents a sub-multiple of the voltage on the direct current electrical power line to the voltage comparator 21 to enable use of the voltage comparator with high voltages outside its range. The voltage divider 19 also provides a power line voltage sensing signal to the analog and digital I/O module 15. The sensed power supply voltage and the sensed power line voltage are measured and fed by the analog and digital I/O module 15 to a display (not shown) at the command of the programmed computer 45. The computer 45 also displays the time. The voltage comparator 21 compares the sub-multiple of the voltage on the direct current electrical power line 11 to the threshold reference voltage from the analog and digital I/O module 15 by way of the filter 17 and outputs a low level or a high level output signal depending on which of the compared voltages is higher. Normally, the sub-multiple of the voltage on the direct current electrical power line 11 will be higher than the threshold reference voltage from the analog and digital I/O module 15, and the voltage comparator output will be low. However, when a glitch occurs, the sub-multiple of the voltage on the direct current electrical power line 11 will fall below the threshold reference voltage from the analog and digital I/O module 15, and the voltage comparator output will swing high. The buffer 23 strengthens the voltage comparator output signal and makes it available to the inputs of the integrators 41–44. Each integrator supplies an integrated replica of the voltage comparator output signal to a respective one of the latches 37–40 and sets the latch when the sub-multiple of the voltage on the power line falls below the threshold voltage for a time determined by the time constant of the integrator. At the command of the programmed computer 45, the analog and digital I/O module 15 reads the states of the latches 37–40 and provides the latch state information to the computer and to the display. The programmed computer 45 logs the occurrence of the setting of any of the latches 37–40, after which the programmed computer orders the analog and digital I/O module 15 to reset the latch. Since a latch is only set when the sub-multiple of the voltage on the direct current electrical power line 11 falls below the threshold voltage for a time determined by the time constant of the integrator connected to that latch, the computer log provides a record of the occurrence of any glitches and their extent in time.

A particular set of values which has provided satisfactory operation of the device shown in the FIGURE is set forth below. It will be appreciated that these values are by way of example only.

EXAMPLE

Analog and digital I/O module 15: Integrity Instruments model 232M2ADCT.
Filter 17: consists of a 10 μf capacitor—Kemet model T491D106M025AS—in parallel with a 0.1 μf capacitor—Panasonic model ECJ-1VF1E104Z.
Voltage divider 19: Susumu, Inc. resistors, values 9.09k and 1.02k.
Voltage comparator 21: Texas Instruments model LM-339D.
On-off switch 23: Thomas & Betts model MTG106D.
Wall transformer 25: CUI, Inc. part number DPD120050-P5P (output 16 volts).
Diode 27: On Semiconductor bipolar junction diode, part number MUR110.
Battery pack 29: Eight series-connected Panasonic Alkaline size AA batteries, part number 6AM-6P1X/1S.
Voltage regulator 31: Motorola part number MC78M05CDT.
Voltage divider 33: Susumu, Inc. resistors, values 9.09k and 1.02k.
Buffer 35: Texas Instruments part number 74ACT244.
Latches 37–40: Texas Instruments part number 74HCT74.
Integrators 41–44: RC circuits comprising Susumu Co. part number RR0816P resistors and Kemet, Inc., part number T491D106M025AS capacitors.
Computer 45: Dell Inspiron model 8600 laptop.

It is obvious that many modifications and variations of the present invention are possible in light of the above teachings. It is therefore to be understood that within the scope of the appended claims, the invention may be practiced otherwise than as described.

What is claimed as new and desired to be secured by Letters Patent of the United States is:

1. A device for sensing and capturing the state of a direct current electrical power line comprising:
    detecting means adapted to be connected to the direct current electrical power line for detecting a glitch; and
    recording means connected to the detecting means for recording that a glitch has been detected and the extent of the glitch,
    wherein the detecting means includes a voltage comparator having a pair of inputs and an output, one of the inputs adapted to be connected to the power line, and
    wherein the recording means includes a plurality of latches, and an equal plurality of integrators having different time constants, each integrator connected between the voltage comparator and one of the plurality of latches for supplying an integrated replica of the output from the comparator to the one latch to set the one latch when the voltage on the power line falls below the threshold voltage for a time determined by the respective time constant of the integrator.

2. The device recited in claim 1 wherein the recording means includes:
    an analog and digital I/O module connected to the plurality of latches for reading the states of the respective latches and for resetting any set latch.

3. The device recited in claim 2 wherein the recording means includes:
    a computer connected to the analog and digital I/O module for controlling the operation of the analog and digital module and for logging the occurrence of the setting of a latch.

4. A device for sensing and capturing the state of a direct current electrical power line comprising:
    detecting means adapted to be connected to the direct current electrical power line for detecting a glitch; and
    recording means connected to the detecting means for recording that a glitch has been detected and the extent of the glitch,
    wherein the detecting means includes a voltage comparator having a pair of inputs and an output, one of the inputs adapted to be connected to the power line, and
    wherein the recording means includes a plurality of latches, and an equal plurality of integrators having different time constants, each integrator connected between the output of the voltage comparator and one of the plurality of latches for supplying an integrated replica of the output from the comparator to the one latch.

5. A device for sensing and capturing the state of a direct current electrical power line comprising:
    a voltage comparator having a pair of inputs and an output, one of the inputs adapted to be connected to the power line;
    an analog and digital I/O module connected to the other input of the voltage comparator for supplying a threshold voltage to the voltage comparator;
    plurality of latches;
    an equal plurality of integrators having different time constants, each integrator connected between the output of the voltage comparator and one of the plurality of latches for supplying an integrated replica of the output from the comparator to the one latch;
    the analog and digital I/O module also connected to the plurality of latches for reading the states of the respective latches and for resetting any set latch; and
    a computer connected to the analog and digital I/O module for controlling the operation of the analog and digital module and for logging the occurrence of the setting of a latch.

* * * * *